United States Patent
Heinemann et al.

[11] Patent Number: 5,572,543
[45] Date of Patent: Nov. 5, 1996

[54] LASER SYSTEM WITH A MICRO-MECHANICALLY MOVED MIRROR

[75] Inventors: Stefan Heinemann, Munich; Axel Mehnert, Schongau; Walter Kroy, Ottobrunn; Peter Peuser, Riemerling; Nikolaus P. Schmitt, Munich; Helmut Seidel, Starnberg, all of Germany

[73] Assignee: Deutsch Aerospace AG, Germany

[21] Appl. No.: 318,665

[22] Filed: Nov. 29, 1994

[30] Foreign Application Priority Data

Apr. 9, 1992 [DE] Germany ............... 42 11 898.0
May 13, 1992 [DE] Germany ............... 42 15 797.8
Apr. 3, 1993 [WO] WIPO ............... PCT/EP93/00829

[51] Int. Cl.⁶ ............................................. H01S 3/08
[52] U.S. Cl. ............... 372/107; 372/99; 372/98; 372/92; 372/108
[58] Field of Search ............... 372/107, 108, 372/99, 98, 92

[56] References Cited

U.S. PATENT DOCUMENTS

| | | | |
|---|---|---|---|
| 3,753,150 | 8/1973 | Zar | 372/107 |
| 4,918,704 | 4/1990 | Caprara et al. | |
| 4,954,739 | 9/1990 | Sampsell | |
| 5,200,965 | 4/1993 | Okuyama et al. | 372/107 |
| 5,351,264 | 9/1994 | Kato et al. | 372/107 |
| 5,357,539 | 10/1994 | Otani et al. | 372/107 |
| 5,390,211 | 2/1995 | Clark et al. | 372/92 |
| 5,418,810 | 5/1995 | Eguchi et al. | 372/107 |

FOREIGN PATENT DOCUMENTS

| | | |
|---|---|---|
| 0280299 | 8/1988 | European Pat. Off. |
| 1196447 | 6/1970 | United Kingdom |
| 2157091 | 10/1985 | United Kingdom |
| WO91/02392 | 2/1991 | WIPO |
| WO93/21553 | 10/1993 | WIPO |

OTHER PUBLICATIONS

Patent Abstract of Japan, JP61128588, Jun. 16, 1986, Abstract Published Oct. 28, 1986.

"Active Correction of a Thermal Lens in a Solid Laser. I. Metalmirro with a Controlled Curvature of the Central Region of hte Reflecting Surface," V. V. Apollonov, G. V., et al., 1991 American Institute of Physics, Sov. J. Quantum Elecron.21(1), Jan. 1991, pp. 116–118.

"Micromechanical Light Modular Array Fabricated on Silicon," K. E. Petersen, 1977 American Institute of Physics, vol. 32 No. 8, 15 Oct. 1977, pp. 521–523.

*Primary Examiner*—Leon Scott, Jr.
*Attorney, Agent, or Firm*—Evenson, McKeown, Edwards & Lenahan P.L.L.C.

[57] ABSTRACT

The invention provides a laser system with one or several micro-mechnically produced, actively controlled laser mirrors which are provided with an actuation device, so that the rapid manipulation of small laser mirrors is assured. The mirrors are designed so that they permit an economical production in large numbers.

21 Claims, 5 Drawing Sheets

LASER SYSTEM WITH A MICRO-MECHANICALLY MOVED MIRROR

BACKGROUND AND SUMMARY OF THE INVENTION

The invention relates to a laser system with one or several actively controlled laser mirrors of the type which are actuated by electrostrictive materials, such as piezoelectric ceramics.

Known prior art laser systems of this type essentially are based on the employment of electrostrictive materials, such as piezoelectric ceramics for moving laser mirrors. However, such piezo actuators have considerable disadvantages, because the piezoelectric ceramics are not free of hysteresis, and furthermore usually require high voltage for triggering. In addition, the integration and processing of ceramic elements in the course of producing such laser systems is relatively expensive.

Essential manipulations in such devices are for example the tilting of the mirror or translation along its optical axis. On the one hand, the known systems require the integration of very different materials, so that monolithic production is not possible, and on the other hand piezoelectric ceramics have disadvantages in respect to their mechanical dimensions and the required high voltage. Added to this is the face that piezoelectric ceramics have resonance frequencies typically in the range of 100 KHz, so that the modulation of such ceramics beyond this frequency is possible not, at all, or is possible only with great difficulty. It should also be mentioned that in general self-destruction of the ceramic structure occurs with modulations in the range of the resonance frequency.

Usually, prior art laser mirrors have several dielectric coatings of different refractive indices in alternating sequence, which are applied to a glass substrate by vacuum evaporation. In this case, the thicknesses of the coatings have to be designed as a function of the wave length in such a way that the multi-beam reflection occurring at the boundary surfaces of the coatings leads to the desired degree of reflection by interference. This results in typical coating thicknesses of approximately one quarter of the light wave length (lambda/4) However, such a mirror with a glass substrate cannot easily be miniaturized and also has a relatively large passive mass, so that it cannot be moved very rapidly. Furthermore, such mirrors are relatively expensive, because for high optical quality the substrates must be individually polished, vacuum-evaporation coated and mounted or supported.

Modern lasers, however, are particularly distinguished by increasingly smaller dimension, along with pronounced high power density. Best known in this connection are the semiconductor lasers as well as solid body lasers pumped by semiconductor lasers. Mirrors with excellent optical properties and an exactly defined degree of reflection are required for operating such lasers. In most cases the mirrors are applied directly to the laser-active component in "monolithic" construction by means of a sequence of dielectric coatings. However, it is advantageous for a number of uses if at least one mirror is separated from the laser-active medium. On the one hand, in many cases this results in an improved beam quality and on the other hand it is possible to make the separate mirror to be movable or adjustable. With such an arrangement it is for example possible to perform a frequency modulation of the laser beam, or the laser can be turned on or off in case of slight tilting of the mirror which, when suitably controlled, results in the generation of so-called giant pulses (Q-mode) of very high peak output.

The requirements for compactness of laser mirrors continue to grow because of the increasing demands for further miniaturization. A diode-pumped, miniaturized compact body laser on an optical bank of silicon is disclosed, for example, in German patent document DE-PS 39 25 201, by means of which a compact micro-system can be realized.

It is an object of the present invention to provide a laser system of the type mentioned at the outset, which permits the rapid modulation of small laser mirrors, and whose mirrors are designed so as to permit economic mass production.

In a special embodiment, a miniaturized mirror is to be provided which has no other substrate materials except for the semiconductor substrate (silicon), can be micro-mechanically deflected in defined embodiments, can perform very rapid movements at high frequencies, and can be employed as an adaptive optical mirror system, These and other objects and advantages are achieved according to the invention in which one or more micromechanically produced actively controlled laser mirrors are provided with an actuator which facilitates rapid manipulation thereof. The mirrors are produced by microelectronic fabrication techniques, and shaped from a semiconductor material which is embodied as an actuator mechanism. By means of optical coating techniques, a mirror is formed which can control the emission properties of a laser system, Other objects, advantages and novel features of the present invention will become apparent from the following detailed description of the invention when considered in conjunction with the accompanying drawings.

DETAILED DESCRIPTION OF THE DRAWINGS

Figure 1:
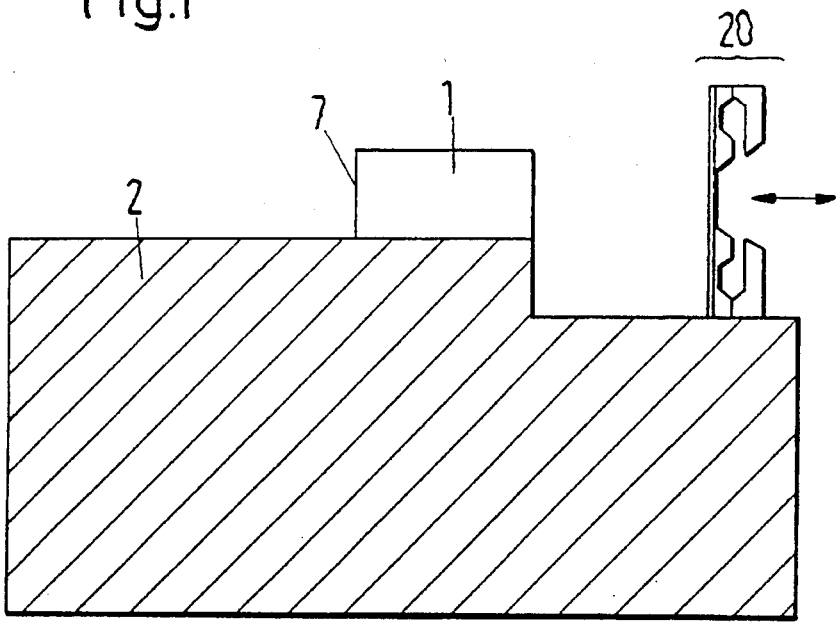
FIG. 1 is a schematic representation of an exemplary embodiment for a semiconductor laser with a micro-mechanically supported mirror for rapid frequency modulation in accordance with the principles of the invention.

In general, prior art laser mirrors are much larger than the other elements of the laser, and must be individually optically polished and coated, as well as mechanically supported. In contrast, the exemplary embodiment of the invention shown in FIG. 1 uses a micro-mechanically produced movable mirror 20 which is not much larger in surface and volume that the laser diode 1. The mirror 20 can be mass produced by means of the conventional wafer techniques, and furthermore can be disposed movably when suitably shaped. The detailed description and design of this mirror will be discussed in connection with the description of FIGS. 5 and 6, in which the mirror can be deflected in the longitudinal direction, so that the resonator length can be actively adjusted, thus enabling a frequency modulation of the laser beam.

The laser according to the invention can also be switched on and off or Q-switched if the laser mirror is shaped so that its surface can be tilted relative to the surface 7 of the semiconductor laser or the semiconductor laser diode 1, by means of micro-mechanical control techniques. Although such mirrors 20 have a reduced production accuracy, they can be mounted without problems if, after mounting, the mirror 20 can be adjusted by micro-mechanical control and subsequently fixed in place. To avoid repetition, more detailed explanations of this will be provided in the descriptions of FIGS. 5 and 6.

Figure 2:
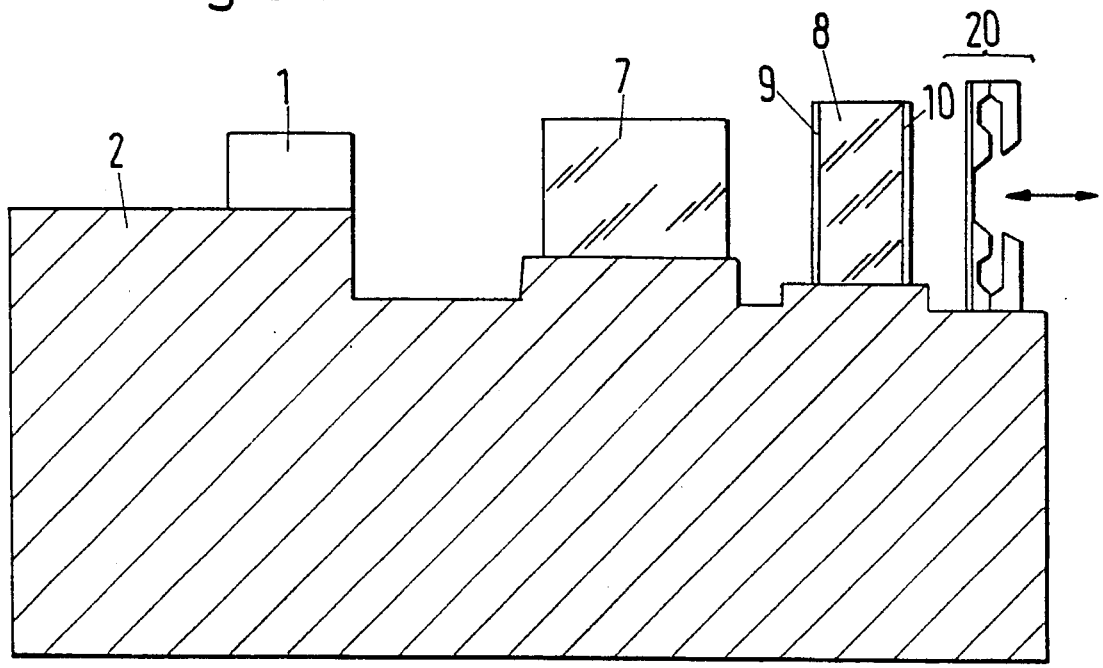
FIG. 2 is a schematic representation of an exemplary embodiment of a diode-pumped solid body laser with a micromechanically supported mirror for rapid frequency modulation in accordance with the principles of the invention.

FIG. 2 shows a similar solid body laser pumped by laser diodes, having the suggested mirror arrangement 20, which has the same properties as those described above. In this embodiment all elements of the laser which have mechanical dimensions similar to the mirror arrangement 20 are mounted on a common base. The semiconductor laser 1 is mounted on a heat sink 2. The laser beam is focused by means of an optical coupling device 7 in a solid body laser crystal 8— for example Nd:YAG—, the front face of which is provided for example with a coating 9, which is highly transmitting for the laser diode beam and highly reflective for the solid body laser beam, so that a laser resonator for the solid body laser beam is formed between the mirror coating 9 and the coating of the micro-mechanical mirror 20. This arrangement permits frequency modulation, switching on and off and Q-switching, by means of active adjustment of the mirror 20.

Figure 3:
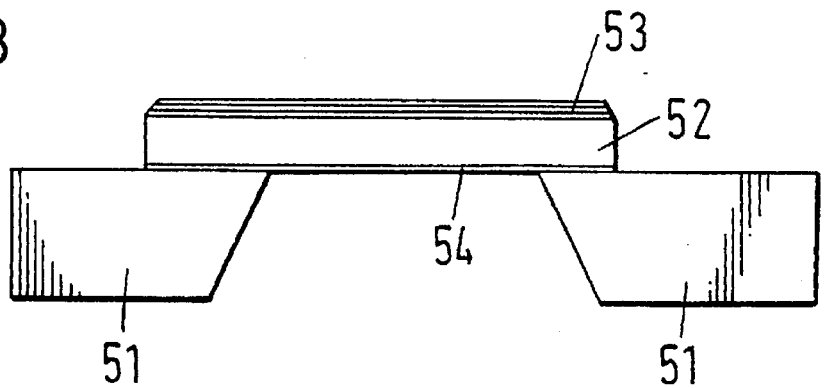
FIG. 3 is a schematic representation of an embodiment of a micro-mechanically supported laser mirror with a small glass plate as the mirror substrate in accordance with the principles of the invention.

An embodiment of a micro-mechanical laser mirror is shown in FIG. 3, which consists of an anisotropically etched semiconductor substrate 51 connected with a mirror substrate 52. The mirror substrate 52 is coated on the one side with a partially reflecting mirror coating 53 and on the back with an anti-reflection coating 54 for the laser wave length.

Figure 4:
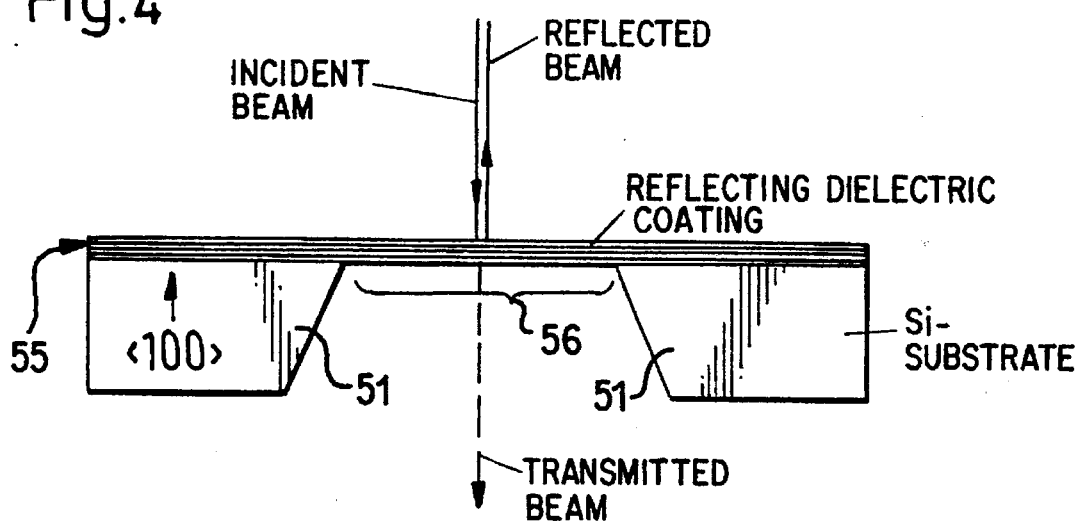
FIG. 4 is a schematic top view of an embodiment of a micro-mechanically supported laser mirror in accordance with the principles of the invention wherein the dielectric mirror is produced without a mirror substrate.

A mirror embodiment with a so-called free-floating mirror coating without a substrate is represented in FIG. 4. This embodiment can also be advantageously employed in the present case, because omission of the substrate 52 permits a particularly simple construction and a small moved mass.

Figure 4A:
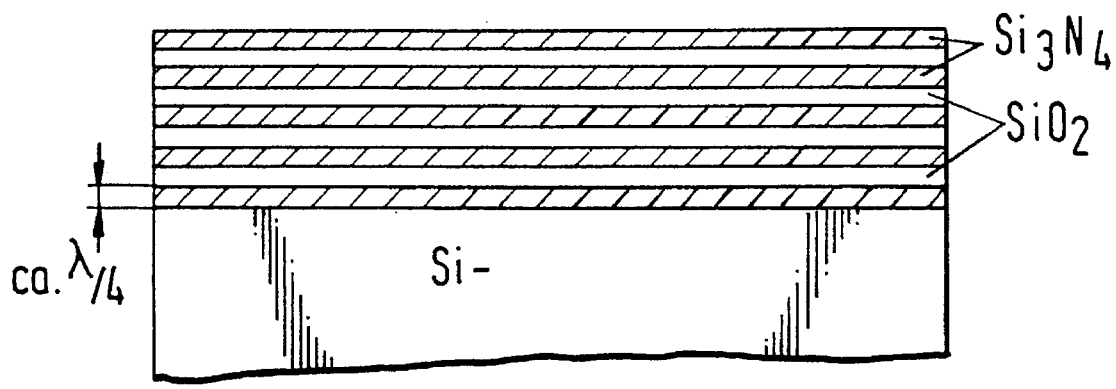
FIG. 4a is a schematic representation of a cross section through a dielectric multi-layer system prior to thinning down the silicon substrate.

In its simplest form the mirror—without an externally predeterminable mobility—consists of a highly polished silicon substrate 51 of a quality which is usual in microelectronics with the crystal orientation <100> or <110>. (In principle, other monocrystalline substrates, such as GaAs, InP or quartz can be used.) This substrate is provided with suitable multi-layered dielectric coatings. Coatings of silicon oxide ($SiO_2$) and silicon nitrate ($Si_3N_4$) are particularly suitable, because they are very compatible with standard silicon techniques. But sequential coatings of $SiO_2$ and $TiO_2$, among others, are also suitable. Coatings of this type can for example be produced by deposition from the gaseous phase (CVD, LPCVD) or with plasma assistance (PECVD)-Vacuum evaporation and sputtering are also possible. The thicknesses as well as the number of individual coatings are calculated in accordance with the desired optical properties (reflection, transmission). Typically they range around lambda/4 (approximately 100 to 200 nm for visible light), FIG. 4a shows such a coating step on a greatly enlarged scale.

Following application of the optically active coatings, the silicon substrate is completely removed from the active mirror area 56 by etching techniques, so that the dielectric coating package acts as a free-floating mirror (FIG.4). This can be achieved with conventional wet-chemical etching solutions, for example KOH. Provision for a highly planar coating can be made by a suitable setting of the coating-coherent mechanical tensions.

It is advantageous for some uses if the reflective property of the mirror can be designed so it is variable over its surface in order to eliminate or minimize considerably undersized refractive effects.

Figure 5:
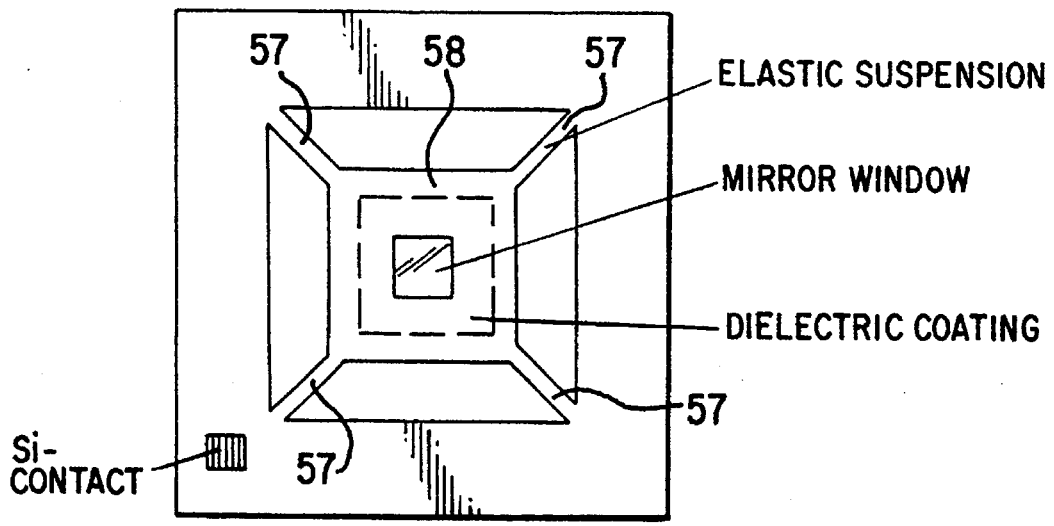
FIG. 5 is a sectional top view which shows the micromechanical manipulation devices of the laser mirror, wherein the movement takes place perpendicularly thereto.
Figure 4B:
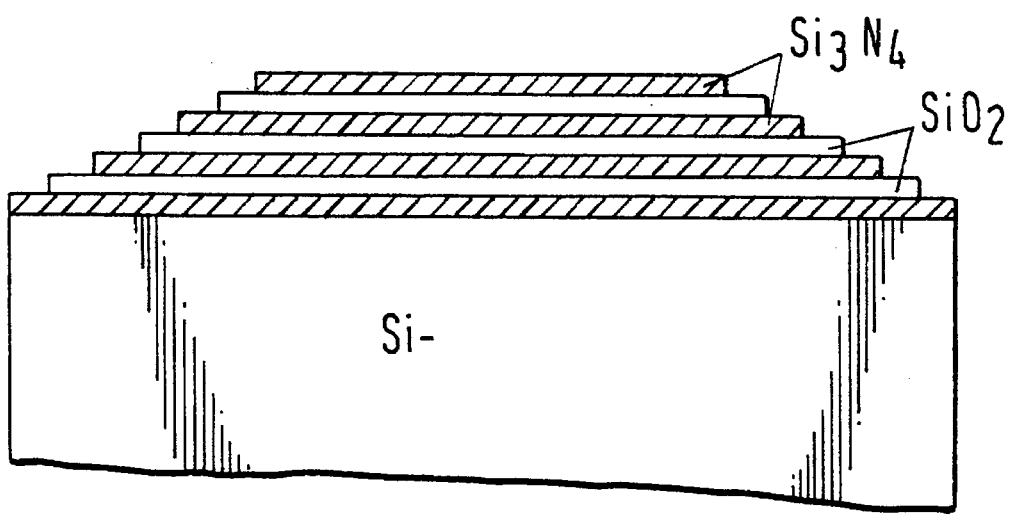
FIG. 4b is a schematic representation of a coating of a laser mirror with locally different reflection properties for forming a so-called Gaussian mirror.
Figure 6:
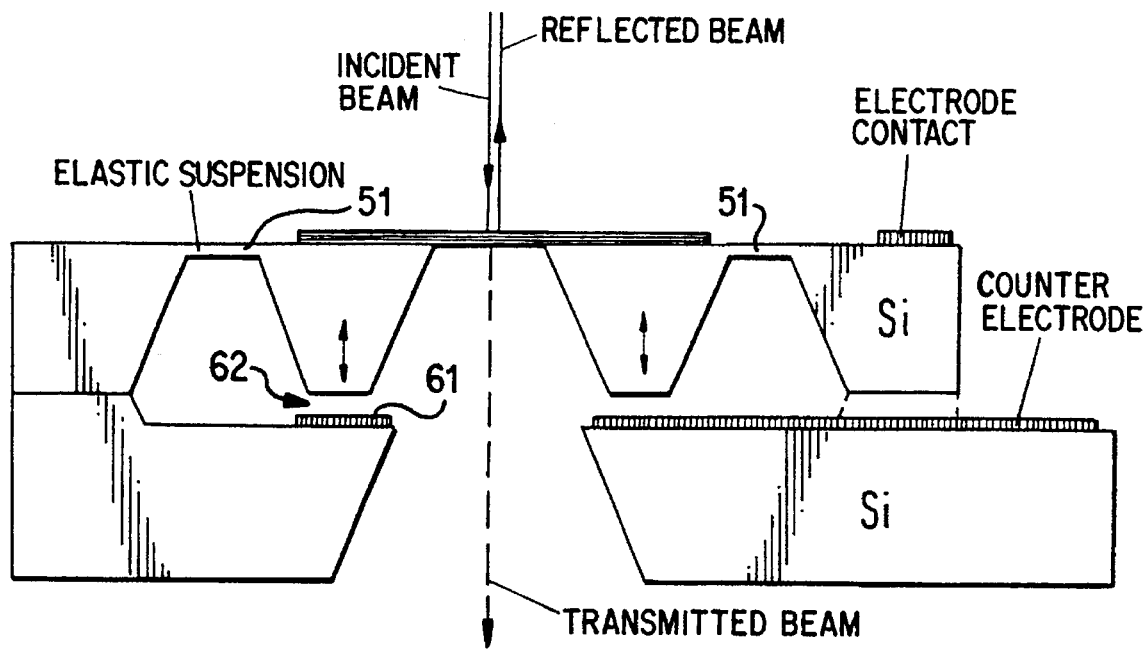
FIG. 6 is a further sectional view of the design of a micro-mechanical actuator.

There are particular uses wherein the reflecting properties are intended to be varied in accordance with the Gaussian function (Gaussian mirror). By the inclusion of microelectric production techniques (for example lithography, selective wet-chemical or dry etching methods), it is possible to produce such profiles economically by the suitable design of the multi-coating system with locally varied coasting thicknesses. An exemplary embodiment is illustrated in FIG. 4b FIGS. 5 and 6 illustrate the detailed structure of the mirror as used in the arrangement in accordance with FIGS. 1 and 2. FIG. 5 shows this mirror in a top view. Silicon substrates can be etched for example in such a way that a small silicon surface 58 carried on movable elastic suspension members 57, supports either the mirror substrate in accordance with FIG. 3 or a free-floating mirror coating in accordance with FIG 4. Because of the elastic suspension, it is possible, depending on the disposition and control by the actuators, to translate or tilt this silicon surface anywhere. The exemplary embodiment in FIG. 5 shows a parallel deflection arrangement which is advantageous, for example, for frequency modulation of the laser used. In this case it is for example possible to achieve a highly symmetrical, diagonal disposition of the elastic suspension members. A single counterelectrode (FIG. 6) is provided at the lower cover wafer.

Figure 5A:
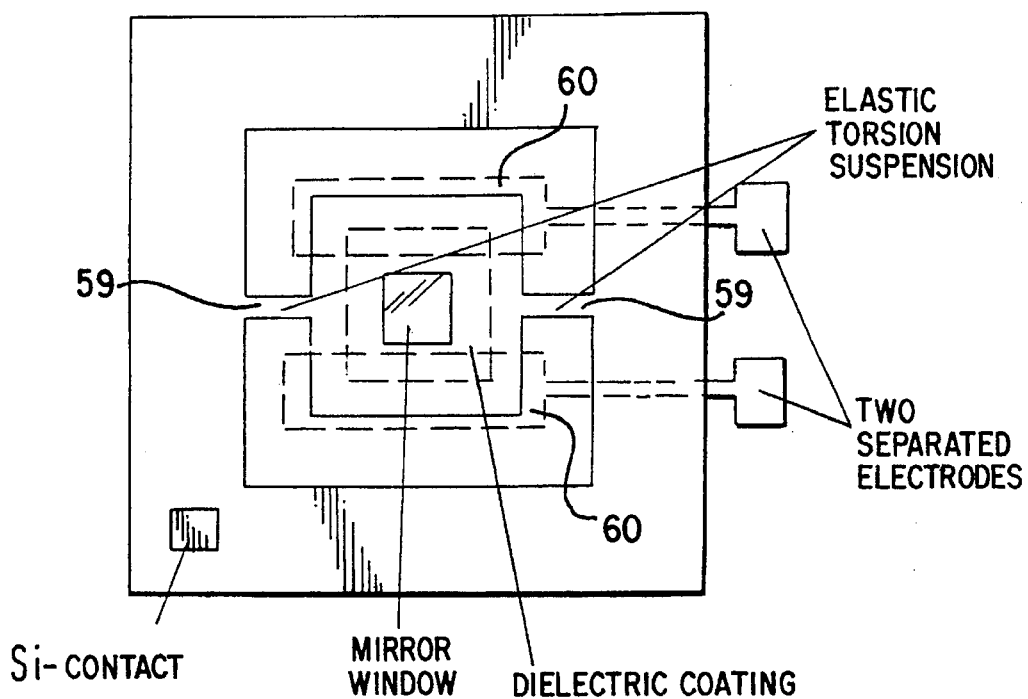
FIG. 5a is a schematic top view of an exemplary embodiment of a movable mirror for tilting movements.

An arrangement in accordance with the same principle results in a slight variant in FIG. 5a, which is suitable for tilting movements of the mirror, for example to realize Q-switching of the laser resonator or an adjustment of the mirror element. Suspension in this case is provided by two torsion bars, and the electrodes are divided into two equal halves 60 which are controlled independently of each other.

FIG. 6 is a sectional view which shows the details of the control and design of the actuators. It can be seen that between the elastic suspension members 57 and the mirror coating respectively, one electrode is disposed oil the upper wafer opposite a counter-electrode 61, and separated from it by an air gap 62. If charges are applied to the electrodes, this results, depending on the sign of the charge, in an attraction or repulsion force, and thus— depending on the control of the electrodes and the arrangement of the suspension members—in a translatory or tilting movement of the mirror. If the same charge is applied to all electrodes and counter-electrodes, an even translation results. If the charge is varied, tilting results. Tilting can be generated especially efficiently in a design with torsion bars in particular, such as shown in FIG. 5a.

If in the course of translatory displacement the charges are applied in a rapid periodic fashion (a.c. voltage), the mirror is periodically translated- However, it is known that the translation of a laser resonator mirror results in a frequency change of the laser and a rapid period translation also in a rapid frequency modulation.

By tilting the mirror, it can either be adjusted so as to set an optimal operating point of the system—which permits reduced requirements for mounting accuracy—, or it can be periodically tilted so that the laser is switched away from the optimal operating point by maladjustment of the mirror. If this is performed at suitable intervals and suitable clock conditions, it leads to the known phenomenon of the generation of giant pulses of the laser (Q-switching or Q-mode).

The mirror herein described is designed by etching techniques in such a way that the optically active area is suspended freely movable on thin suspension members of silicon or a suitable thin film. For reasons of integrateability it is advantageous to use electrostatics for the introduction of power, with the silicon substrate electrically connected so that the mirror represents an electrode of a capacitor arrangement. This unit is connected with a second silicon substrate into which a penetrating opening for the transmission of a laser beam has been cut. Furthermore, a flat depression has been provided which defines the distance between the electrode and the movable part and thus the freedom of movement of the mirror. Capacitor counter-electrodes are attached inside this depression. These two substrates are connected with each other by suitable processes—such as anodic bonding of Si—Si bonding. The mirror is actuated electrostatically by applying an external voltage to the electrodes, (It is also possible, of course, to use actuating means other than electrostatics, for example piezo-electricity or magnetism; is possible for this purpose to add a correspondingly small adjusting element or a permanent magnet to the mirror arrangement.)

Figure 5B:
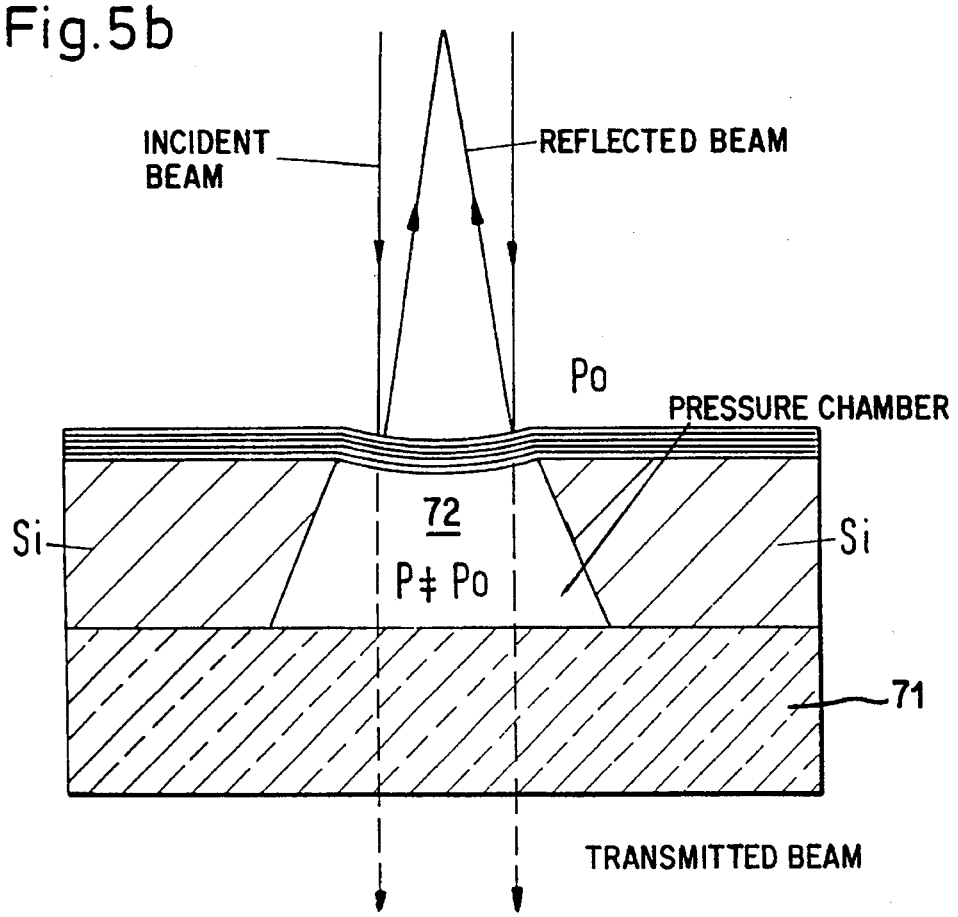
FIG. 5b is a schematic representation of an exemplary embodiment of an adaptive mirror with adjustable curvature of the reflecting diaphragm by the directed application of an underpressure or overpressure in the pressure chamber.

A further possibility arising from the thin film arrangement of the mirror is the directed curving of the mirror surface by applying underpressure or overpressure. In this manner, it is possible, for example, to adjust the focal length of the mirror, so that directed focusing becomes possible. An exemplary embodiment of such an arrangement is shown in FIG. 5b. The base mirror element is connected with a transparent substrate 71— for example glass—, to form a closed hollow chamber 72 which is connected via a directedly controllable conduit (not shown) with an external pressure reservoir or a pump (not shown).

A mirror is thus created which, based on its very small mass because of its type of construction, can perform very rapid movement at high frequencies. Because of the missing substrate in the optical path of the beams, it is not necessary to provide an antireflection coating on the back. Such a laser mirror can be produced with methods of the micro-system technology so that their size lies within the order of magnitude of modern laser-active elements of the small and medium output range. (Laser diodes are typically 200 µm×500 µm×30 µm, while solid body lasers are typically 500 µm ×1 mm ×1 mm.)

it is also possible to use actuating techniques other than electrostatics, for example piezo-electricity or magnetism. It is possible for this purpose to add a corresponding small adjusting element or a permanent magnet to the mirror arrangement.

Figure 7:
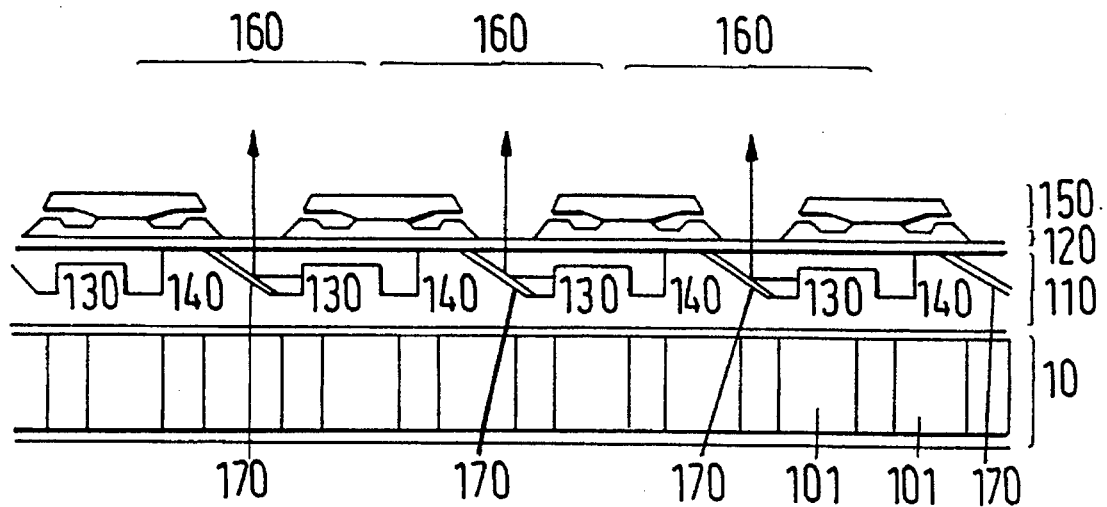
FIG. 7 is a schematic representation of a further embodiment of a micro-mechanically support laser mirror in the plane of the substrate with elements for beam deflection (a so-called "folded resonator"), wherein several laser systems are disposed in a plane.

FIG. 7 shows a preferred embodiment of an arrangement in which two-dimensional, arrays of laser systems with micro-mechanically manipulatable mirrors are produced or respective wafers. (For simplicity, only one array of semiconductor laser diodes with micro-mechanically manipulatable mirrors is shown; however, in an analogous manner it is also possible to produce solid body lasers pumped by laser diodes.) In this illustrated embodiment, arrays of micro-mechanically manipulatable laser mirrors 160 are etched out of a silicon substrate and appropriately optically coated, so that a two-dimensional arrangement of mirrors at regular spacings with appropriate control elements is distributed over the silicon wafer surface. In this case it is also possible to produce the mirrors add the mirror controls on two silicon wafers, which are connected with each other so that the mirror control is exactly positioned in respect to the mirror elements. The wafer 150—provided with a dielectric coating 120—is exactly positioned in relation to a second wafer 110, on which a two-dimensional array of laser diodes 130 and beam deflection elements 140 is placed, also with regular spacing. This wafer 110 can for example be made of silicon into which the beam deflection elements 140 have been etched and provided with a reflecting mirror coating 170 and on which the diodes 130, mostly produced on a GaAs basis, are correspondingly exactly mounted. However, the wafer 110 can also consist of a monolithic GaAs arrangement, into which the laser didoes have been appropriately structured and etched, the same as the beam deflection elements 140. This wafer 110 itself is now connected with a cooling unit 100, which for example consists of micro-channel coolers produced on the basis of silicon. The radiation of the laser diodes emitted parallel to the wafer surface 110 is now deflected via the beam deflection elements 140 in such a way that it falls perpendicularly to the wafer surface of the wafer 150 on the micro-mechanically movable mirrors, is partially reflected back into itself from there and partially exits perpendicularly to the mirror surface as a laser beam 170.

Such an arrangement makes possible the formation of a two-dimensional array of individual laser diodes which for example can be tuned to the same frequency. Such laser diodes, however, can also be rapidly amplitude or frequency modulated individually. Such an arrangement can also be used to create Q-switched laser diodes, or to permit the appropriate control of the amplitude, frequency or Q of solid body lasers pumped by laser diodes. Production by means of conventional batch techniques presents no problems, because it is only necessary to etch and structure a plurality of wafers in a known manner, which thereafter are positioned in respect to each other and connected to form a whole.

We claim:

1. A laser microsystem of the type having at least one mechanically actuatable laser mirror arrangement disposed in a propagation path of a laser beam, for regulating propagation of said laser beam in said path, and at least one electro-mechanical means for physically displacing said mirror arrangement, wherein said laser mirror arrangement comprises:

a carrier element; and a mirror element comprising an optical coating, said optical coating being deposited on said carrier element;

said carrier element being supported on a semiconductor substrate by means of at least an elastic suspension member formed by etching said semicoductor, whereby said carrier element and said mirror are displacable within said propagation path of said laser beam;

wherein said carrier element is actuatably coupled to said electro-mechanical means for physical displacement of said carrier element and said mirror, to regulate said propagation of said laser beam.

2. A laser system in accordance with claim 1, wherein the mirror element comprises a free-floating mirror coating.

3. A laser system in accordance with claim 1 wherein the mirror element comprises a connection of semiconductor elements and optically coated mirror substrate elements.

4. A laser system in accordance with claim 1 wherein for modulating a laser emission frequency of said microsystems, said electromechanical means comprises means for actuating the mirror element to move longitudinally.

5. A laser system in accordance with claim 1 wherein for generating large pulses, said electromechanical means comprises means for actuating the mirror element to move in a tilting manner.

6. A laser system in accordance with claim 1 wherein said electromechanical means comprises means for actuating the mirror element to perform a complex movement.

7. A laser system according to claim 1 comprising an array containing a plurality of laser mirror arrangements and a plurality of electro-mechanical means, and further comprising:

an array of laser diodes arranged on a semiconductor material, each of said diodes having a beam deflector associated therewith on said semiconductor material;

said array of laser diodes being arranged opposite said array of mirror arrangements, whereby each of said laser diodes is coupled in communication with at least one mirror arrangement.

8. A laser system in accordance with claim 7 wherein the array containing a plurality of laser mirror arrangements is fixedly connected with the array of laser diodes, and comprises a plurality of mirror sizes and a plurality of laser systems.

9. A laser system in accordance with claim 1 wherein an array of laser diodes applied to a semiconductor material are placed opposite an array of laser mirrors, to form an array of solid body lasers pumped by laser diodes with at least one external laser mirror per laser diode.

10. A laser system in accordance with claim 1 wherein the semiconductor material supporting the laser diodes has cooling channels associated therewith for keeping the temperature of the heat-generating laser diodes constant.

11. A micro-mechanical mirror for a laser system, said mirror being of the type having coatings of varied refractive indices formed in alternating sequence by means of vacuum evaporation, said mirror comprising;

a silicon or mono-crystalline substrate; and a multi-layered coating applied to said substrate, said coating being made from a material selected from the group consisting of: a dielectric material and a metallic material;

wherein an area of said substrate adjacent said multi-layered coating is completely removed by etching to form suspension members which displacably support the multilayered coating, whereby the multi-layer coating acts as a free-floating mirror.

12. A micro-mechanical mirror in accordance with claim 11 wherein the reflecting properties of the active mirror area are variable.

13. A micro-mechanical mirror in accordance with claim 11 wherein the optically active mirror area is a Gaussian mirror.

14. A micro-mechanical mirror in accordance with claim 11 wherein said suspension members comprise thin supporting arms made of the semiconductor substrate.

15. A micro-mechanical mirror in accordance with claim 11 wherein the semiconductor substrate is electrically connected so that the mirror constitutes an electrode which is capactively coupled with a second semiconductor substrate, and wherein a flat depression is provided which fixes the electrode distance a the movable part, and thus also freedom of movement of the optically active mirror area.

16. A micro-mechanical mirror in accordance with claim 11, wherein the two semiconductor substrates are connected with each other by a bonding selected from the group consisting of anodic bonding and direct Si—Si bonding.

17. A micro-mechanical mirror in accordance with claim 11 wherein said actuating means comprises one of electrostatic, piezo-electric and magnetic elements, and wherein adjusting elements are coupled with the mirror arrangement.

18. A micro-mechanical mirror in accordance with claim 11 further comprising pneumatic means for applying a curvature to said mirror by applying a variable pressure to at least one side thereof, thereby changing a focal length of the mirror.

19. A laser system in accordance with claim 1, wherein said electromechanical means comprises means for displacing said mirror element to perform amplitude modulation of the laser.

20. A laser system in accordance with claim 1 wherein coupled optical devices and solid body laser crystals provided with beam deflection units are placed opposite an array of laser mirrors to form an array of solid body lasers pumped by laser diodes with at least one external laser mirror per laser diode.

21. A micro-mechanical mirror in accordance with claim 11 wherein said suspension members comprise a suitable thin film.

* * * * *